United States Patent
Lee et al.

(10) Patent No.: US 8,492,798 B1
(45) Date of Patent: Jul. 23, 2013

(54) ELECTRICAL FUSE WITH SACRIFICIAL CONTACT

(75) Inventors: Shih-Lin S. Lee, San Jose, CA (US);
Richard Smolen, Redwood City, CA (US); Peter Mcelheny, Morgan Hill, CA (US); Christopher Pass, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/820,688

(22) Filed: Jun. 22, 2010

Related U.S. Application Data

(62) Division of application No. 11/216,682, filed on Aug. 30, 2005, now Pat. No. 7,759,226.

(51) Int. Cl.
*H01L 29/00* (2006.01)

(52) U.S. Cl.
USPC .................................. 257/209; 257/529

(58) Field of Classification Search
USPC .................................. 257/209, 529
See application file for complete search history.

(56) References Cited

U.S. PATENT DOCUMENTS 7,378,718 B2 * 5/2008 Tsutsui ..................... 257/529

* cited by examiner

*Primary Examiner* — Eugene Lee
(74) *Attorney, Agent, or Firm* — Ward & Zinna, LLC

(57) ABSTRACT

The electrical fuse includes a cathode pad, an anode pad and a fuse link connecting the cathode pad to the anode pad. The cathode pad includes a group of multiple electrical contacts and a solitary electrical contact disposed a predetermined distance from the group and near the fuse link, i.e., between the group of multiple electrical contacts and the fuse link. The cathode and anode pads as well as the fuse link include a polysilicon layer and a silicide layer.

2 Claims, 5 Drawing Sheets

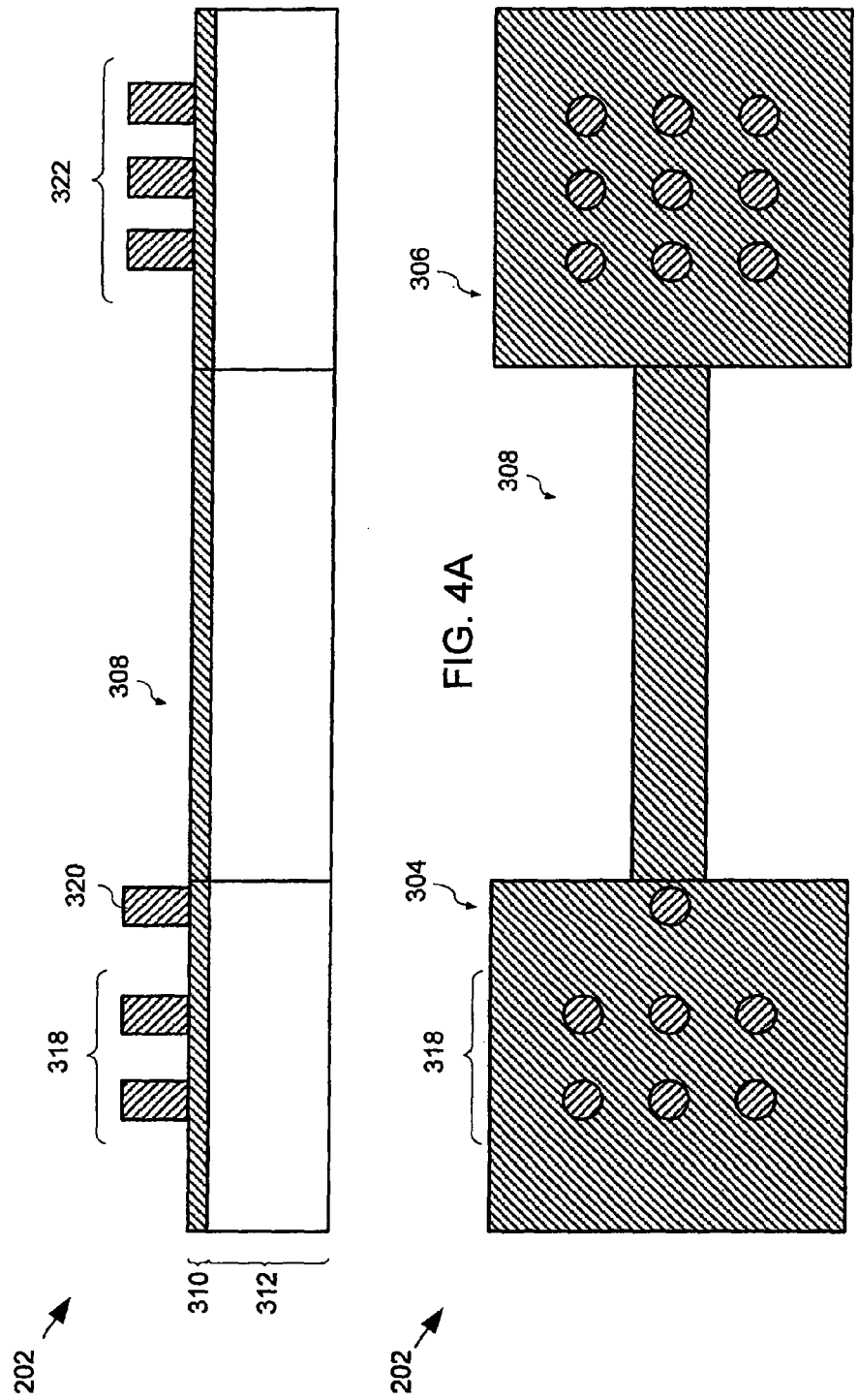

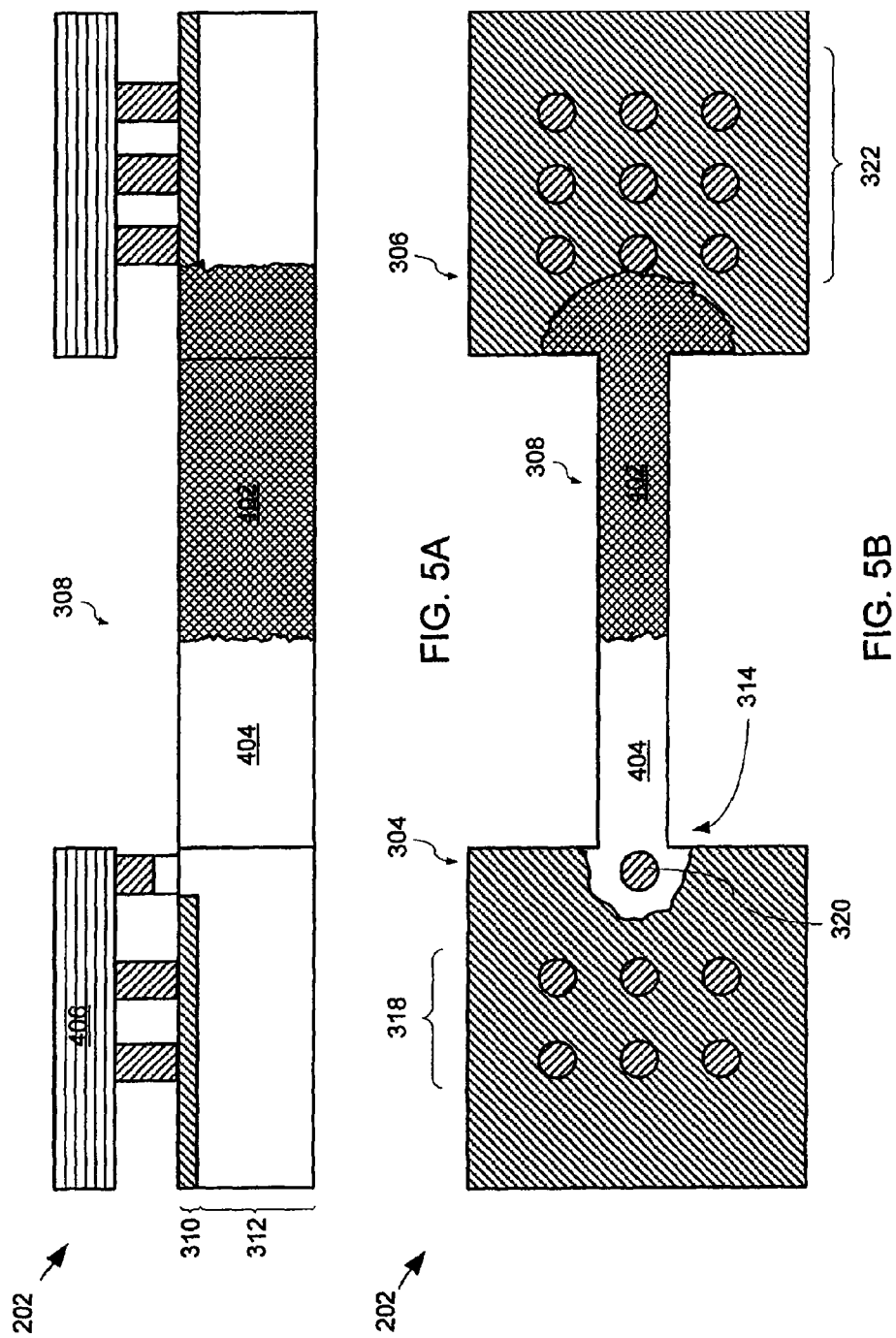

ELECTRICAL FUSE WITH SACRIFICIAL CONTACT

This is a divisional of application Ser. No. 11/216,682, filed Aug. 30, 2005 now U.S. Pat. No. 7,759,226, for "Electrical Fuse with Sacrificial Contact," which application is hereby incorporated by reference herein.

TECHNICAL FIELD

The embodiments disclosed herein relate to electrical fuses used in integrated circuits, and in particular to an electrical fuse having a sacrificial contact.

BACKGROUND

Some semiconductor devices require the use of fuses. Two common types of fuses are the laser fuse and electrical fuse or efuse. Laser fuses are programmed, broken down or "blown" by applying a focused laser beam at the fuse, while electrical fuses are programmed, broken down or "blown" by passing a suitable electrical current through the electrical fuse. Such fuses are used in semiconductor devices for rerouting signal paths, enabling redundancy, providing programming functions, codes in logic chips and encryption, etc.

Electrical fuses are often preferred over laser fuses as they have a significantly lower production cost than laser fuses and may be programmed once the integrated circuit containing the fuse is already packaged. In use, a predetermined programming voltage is required to program or blow such electrical fuses. Generally, it is desirable for the predetermined programming voltage to be compatible with the voltage(s) required by the remainder the integrated circuitry. However, as the performance of integrated circuits increase and circuit sizes decrease, the voltages required by the remainder of the circuitry have lowered significantly. For example, emerging advanced technologies, e.g., <100 nm, require a Vcc significantly lower than 3.3v. Moreover, the boom in cellular telephones and handheld computing devices has provided the impetus for even lower power integrated circuits.

Currently, however, voltages of at least 3.3v are required to program or blow an electrical fuse. As mentioned above, this voltage is significantly higher than the voltage required by certain integrated circuitry, and therefore requires special design attention. For example, current integrated circuits that include electrical fuses may require additional power sources and circuit routing for the electrical fuses. To maintain high fuse blow power, blowing transistor sizes increase at lower voltages to increase current, or charge pumps are needed to boost voltage. Accordingly, it would be highly desirable to provide an electrical fuse that is capable of being programmed or blown at lower voltages than those currently employed.

Furthermore, to reduce costs and increase manufacturing efficiency it is desirable that the electrical fuses included in integrated circuits be fabricated from the same materials and using the same thin-film processes as the remainder of the integrated circuit. It is also desirable that the electrical fuses have as small a size as possible to minimize the overall size of the integrated circuit.

In light of the above, it would be highly desirable to provide an electrical fuse that is capable of being programmed at lower voltages and is made from the same materials and using the same processes used to make the remainder of the integrated circuit.

SUMMARY

According to the invention there is provided an electrical fuse. The electrical fuse includes a cathode pad, an anode pad and a fuse link connecting the cathode pad to the anode pad. The cathode pad includes a group of multiple electrical contacts and a solitary electrical contact disposed a predetermined distance from the group and near the fuse link, i.e., between the group of multiple electrical contacts and the fuse link. The cathode and anode pads as well as the fuse link include a polysilicon layer and a silicide layer.

According to the invention there is also provided integrated circuit that includes at least one electrical fuse, as described above. Yet another embodiment of the invention provides a computer system having at least one integrated circuit, as described above.

The above described electrical fuses require a significantly lower programming voltage (power, current) than current electrical fuses. Furthermore, standard semiconductor fabrication techniques may be used to fabricate the above described electrical fuses, i.e., the fabrication process is compatible with current mainstream semiconductor processes, where no additional process steps are required. This significantly reduces design complexity and manufacturing costs. The above described electrical fuses also occupy the same amount of space on the integrated circuit as current electrical fuses. The present invention also reduces or eliminates the need for pump circuitry to raise the voltage supplied to the integrated circuit enough to program the fuse. Moreover, programming the above described electrical fuse provides less of a thermal disturbance to the surrounding oxide layers by having a critical to low coefficient of thermal expansion, thereby reducing both thermal stress in the integrated circuit and subsequent device failures.

BRIEF DESCRIPTION OF THE DRAWINGS

For a better understanding of the nature and objects of the invention, reference should be made to the following detailed description taken in conjunction with the accompanying drawings, in which:

FIG. 4A is a side view of the electrical fuse shown in FIG. 3;

FIG. 4B is a top view of the electrical fuse shown in FIG. 4A;

FIG. 5A is a side view of the electrical fuse of FIG. 3 after programming; and FIG. 5B is a top view of the electrical fuse shown in FIG. 5B.

Like reference numerals refer to the same or similar components throughout the several views of the drawings.

DETAILED DESCRIPTION OF THE EMBODIMENTS

The following describes various embodiments of electrical fuses used in integrated circuits. In some embodiments, the integrated circuit forms part of a semiconductor device, which may in turn form part of a larger computer system. In some embodiments, the electrical fuse is capable of being programmed at a lower voltage than present electrical fuses.

Figure 1:
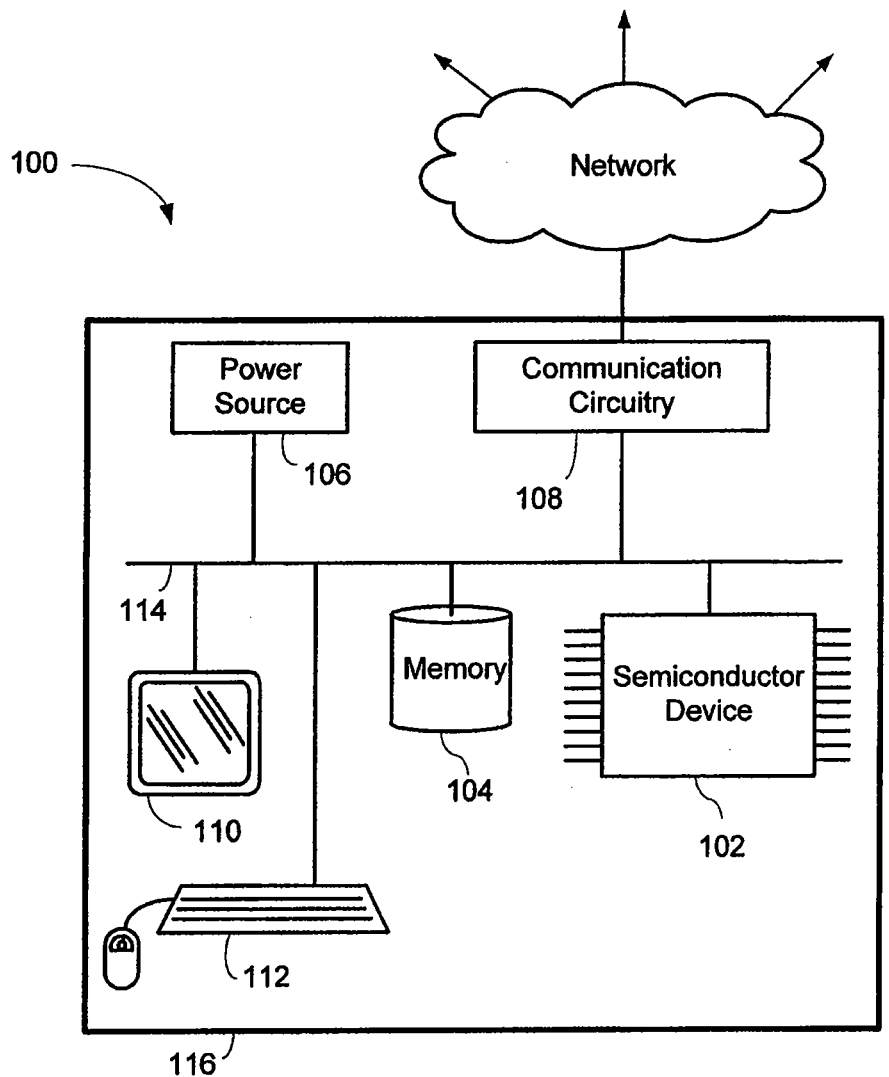
FIG. 1 is a block diagram of a computer system using a semiconductor device that includes electrical fuses, according to a further embodiment of the invention.

FIG. 1 is a block diagram of a computer system 100 that includes at least one semiconductor device using an integrated circuit that includes electrical fuses of the invention.

The computer system 100 may include any type of computing device, such as a mainframe computer, network computer, personal computer, laptop, handheld computing device, cellular telephone or the like. The computer system 100 contains various components, including, but not limited to, at least one semiconductor device 102, a memory 104, a power source 106, communications circuitry 108, input and/or output devices, e.g., a monitor 110 and a keyboard and mouse 112 and at least one bus 114 that connects the aforementioned components. In some embodiments, these components are at least partially housed within a housing 116. The semiconductor device may be any suitable semiconductor device, such as a Complex Programmable Logic Device (CPLD), a Field Programmable Gate Array (FPGA) or an Application Specific Integrated Circuit (ASIC). The semiconductor device contains one or more integrated circuits housed within a package, as described below.

Figure 2:
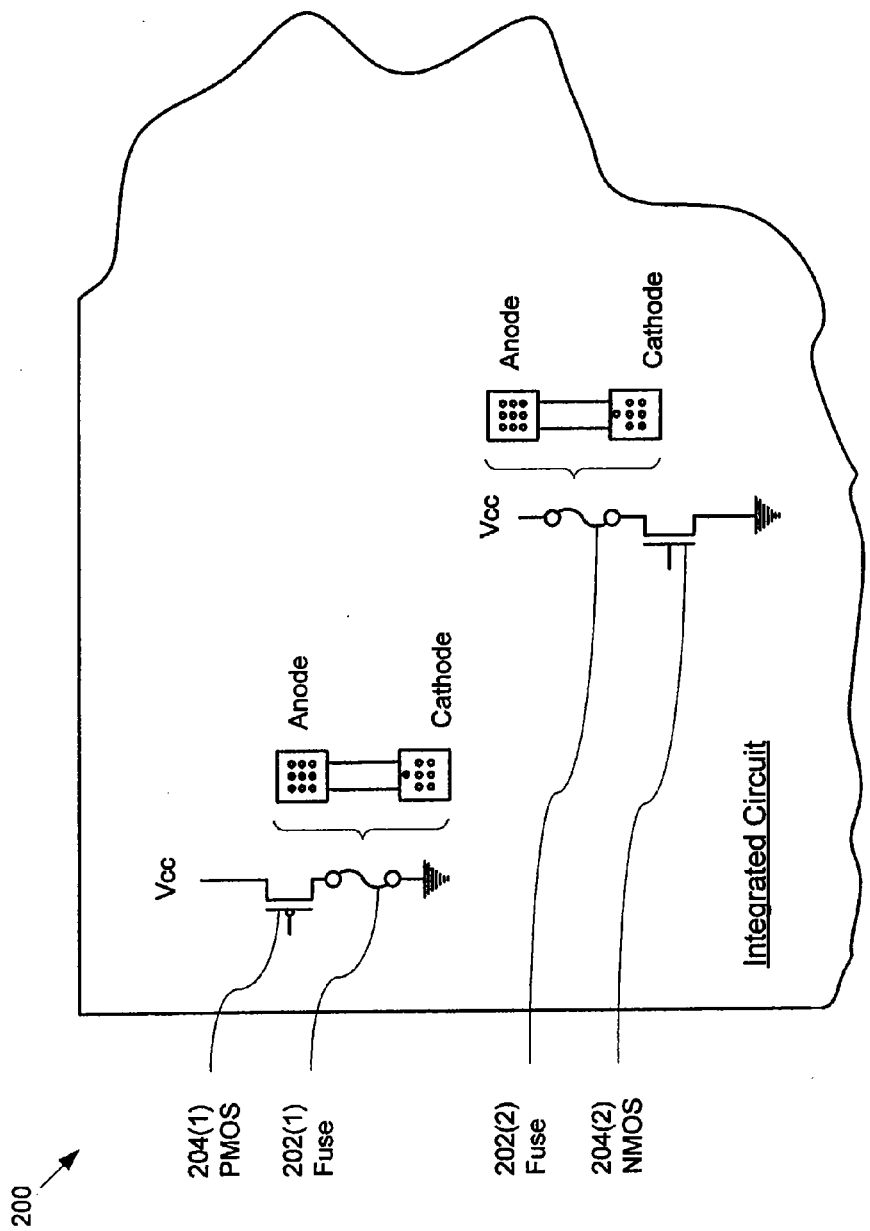
FIG. 2 is a schematic of an integrated circuit that includes electrical fuses.

FIG. 2 is a schematic of an integrated circuit 200 that includes electrical fuses 202. The electrical fuses 202 may be electrically coupled to one or more transistors 204, such as PMOS 204(1) or NMOS 204(2) transistors. A supply voltage $V_{cc}$ or an electrical fuse programming voltage $V_P$ is supplied to the fuses 204 The electrical fuse programming voltage $V_P$ is usually the highest supplied voltage of the IC. In some embodiments, the cathode is oriented towards ground and the anode is oriented towards $V_{cc}$. One of the electrical fuses 202 will now be described in detail.

Figure 3:
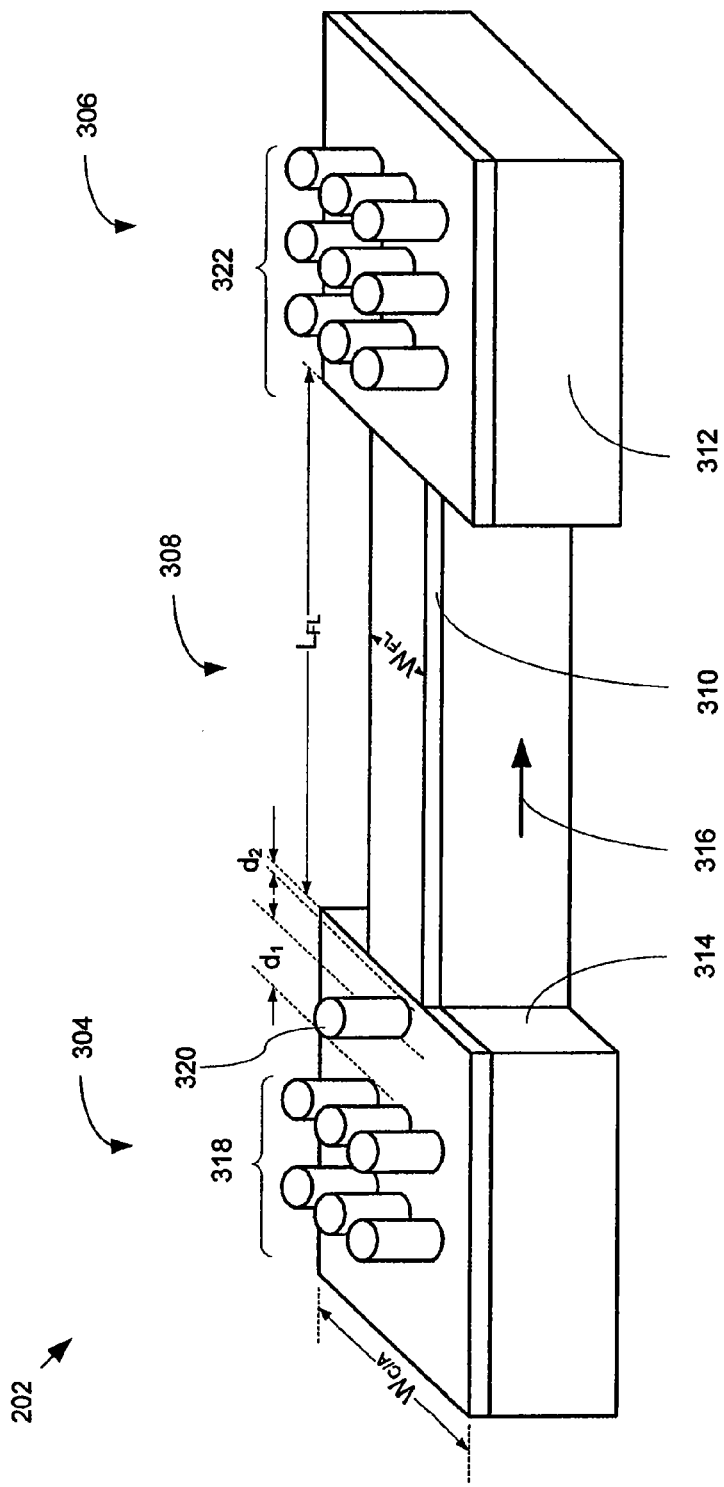
FIG. 3 is an oblique view of an electrical fuse before programming, according to an embodiment of the invention.

FIG. 3 is an oblique view of one of the electrical fuses 202 shown in FIG. 2. The electrical fuse 202 includes a cathode pad 304, an anode pad 306 and a fuse bridge or link 308 connecting the cathode pad 304 to the anode pad 306. The electrical fuse 202 has a length $L_{FL}$ measured in a direction parallel to a current path from the cathode pad 304 to the anode pad 306, as indicated by arrow 316. The electrical fuse 202 also has a width $W_{FL}$ that is perpendicular to the current path 316.

In some embodiments, the cathode pad 304, anode pad 306 and fuse link 308 comprise a common silicide layer 310 fabricated on top of a polysilicon layer 312. The polysilicon layer 312 may be formed on an oxide layer (not shown). The silicide layer 310 and polysilicon layer 312 may be fabricated using the same semiconductor fabrication processes used to fabricate the remainder of the integrated circuit 200 (FIG. 2). In some embodiments, the polysilicon layer 312 is only lightly doped. This allows the silicide layer 310 to confine the programming current in the silicide layer and allows for easier electromigration of the silicide during programming of the electrical fuse 202. In other embodiments, any suitable doped or un-doped polysilicon layer may be used.

The cathode pad 304 includes a group of multiple electrical contacts 318. In some embodiments, the cathode pad 304 also includes a solitary electrical contact 320 disposed a predetermined distance $d_1$ from the group of electrical contacts and near the fuse link 308. In some embodiments, $d_1$ is bigger or equal to the minimum design rule distance between contacts. In other embodiments, $d_1$ is less than twice the minimum design rule distance between contacts. For example, for the 90 nm process, $d_1$ is between 140 nm and 240 nm. Also in some embodiments, the solitary electrical contact 320 is disposed a distance $d_2$ from an edge of the cathode pad 304 closest to the fuse link 308. In other embodiments, more than one contact 320 is provided near an edge of the cathode pad 304 closest to the fuse link 308. In some embodiments, the anode pad 306 also includes multiple electrical contacts 322. The electrical contacts 318, 320 and 322 are at least electrically connected to the silicide layer 310.

In some embodiments, the number of electrical contacts in the group 318 is only limited by the space on the cathode pad 304 allowing for the predetermined ($d_1$) distance from the solitary electrical contact 320. The electrical contacts 318 may be made from any suitable material, such as Tungsten. The solitary electrical contact 320 may also be made from any suitable material, such as Tungsten, as long as the solitary electrical contact 320 behaves in the manner described in relation to FIGS. 4-5 below.

In some embodiments, the width of the fuse link ($W_{FL}$) is less than the width of the cathode pad and/or anode pad ($W_{C/A}$). Also in some embodiments, the width of the fuse link ($W_{FL}$) is between a minimum polysilicon dimension (MPD) of a semiconductor process by which the electrical fuse 202 is made and ten times such a minimum polysilicon dimension, i.e., MPD<$W_{FL}$<10 MPD. For example, the minimum polysilicon dimensions for the 90 nm semiconductor process is 130 nm. In other embodiments, the width of the fuse link ($W_{FL}$) is between the minimum polysilicon dimension and five times such minimum polysilicon dimension, i.e., MPD<$W_{FL}$<5 MPD. In still other embodiments, the width of the fuse link ($W_{FL}$) is between the minimum polysilicon dimension and twice such minimum polysilicon dimension, i.e., MPS<$W_{FL}$<2 MPD.

In some embodiments, the length of the fuse link ($L_{FL}$) is between twice the width of the fuse link and twelve times the width of the fuse link, i.e., $2W_{FL}$<$L_{FL}$<$12W_{FL}$. In other embodiments, the length of the fuse link ($L_{FL}$) is between four times the width of the fuse link and twelve times the width of the fuse link, i.e., $4W_{FL}$<$L_{FL}$<$12W_{FL}$. In further embodiments of the invention, the length of the fuse link ($L_{FL}$) is between six times the width of the fuse link and ten times the width of the fuse link, i.e., $6W_{FL}$<$L_{FL}$<$10W_{FL}$. In one other embodiment of the invention, the length of the fuse link ($L_{FL}$) is eight times the width of the fuse link, i.e., $L_{FL}$=$8W_R$.

In some embodiments, the width of at least one of the anode and the cathode ($W_c$ or $W_A$) is between four times the width of the fuse link and twelve times the width of the fuse link, i.e., $4W_{FL}$<$W_{C/A}$<$12W_{FL}$.

In some embodiments, the solitary electrical contact 320 is disposed less than the width of the fuse link ($W_{FL}$) from a junction 314 between the cathode pad 304 and the fuse link 308, i.e., $d_2$<$W_{FL}$. In other embodiments, the solitary electrical contact 320 is disposed less than half the width of the fuse link ($W_{FL}$) from the junction 314, i.e., $d_2$<$0.5W_{FL}$. In yet another embodiment, the solitary electrical contact is disposed a minimum design rule distance for a contact inside of a polysilicon edge from the junction 314, i.e., $d_2$=minimum design rule distance. The minimum design rule distance for a contact inside of a polysilicon edge is dictated by the particular semiconductor process employed. For example, the minimum design rule distance for a contact inside of a polysilicon edge for 90 nm wafers is 30 nm. In one other embodiment, the solitary electrical contact 320 is disposed as close to the junction 314 between the cathode pad 304 and the fuse link 306 as possible.

FIG. 4A is a side view of the electrical fuse 202 shown in FIG. 3, while FIG. 4B is a top view of the electrical fuse 202 shown in FIGS. 3 and 4A. For ease of explanation, the electrical fuse 202 has been shaded as follows: the polysilicon layer 312 has no shading, the silicide layer is depicted in a first cross-hatch pattern and the electrical contacts are shaded with a second cross-hatch pattern. As was shown in FIG. 3, the electrical fuse 202 shown in FIGS. 4A and 4B remains in an un-programmed state, i.e., the fuse is not blown. When the electrical fuse is in its un-programmed state, current can freely flow through the electrical fuse 202 between the group of multiple electrical contacts 318 and 320 on the cathode pad 304 and the electrical contacts 322 on the anode pad.

FIG. 5A is a side view of the electrical fuse of FIG. 3 after programming, while FIG. 5B is a top view of the electrical fuse shown in FIG. 5A. To program the electrical fuse 202, a programming power (programming current and programming voltage $V_P$) is supplied to the electrical contacts 318 and 320 through a metal layer 406. Much of the current follows the path of least resistance through the solitary electrical contact 320 towards the anode. This causes electromigration of the silicide from the silicide layer 310 near the junction 314 of the cathode pad 304 and the fuse link 308, into the fuse link 308. This higher programming current also causes a portion of the solitary electrical contact 320 to be removed as shown, i.e., the solitary electrical contact 320 acts as a sacrificial contact with the removed material from the solitary electrical contact also electromigrating into the polysilicon layer 312. In some embodiments, the removed portion of the silicide layer and the solitary electrical contact is replaced by polysilicon 404, as shown. The combined electromigration of the silicide and removed portion of the solitary electrical contact is shown by the cross-hatching pattern 402.

It is believed that the addition of the removed portion of the solitary electrical contact into the polysilicon layer lowers the melting point of the alloy formed in the polysilicon. This lower melting point allows a lower programming power or voltage to be applied to the solitary electrical contact 320 than previously required to program an electrical fuse. For example, testing has shown that the addition of the sacrificial solitary electrical contact requires a programming voltage of 2.5 v as compared to a programming voltage of 3.3 v for the same current and same electrical fuse except that it does not have a sacrificial solitary electrical contact. In other words, only 75% of the prior programming voltage is required. Although the programming voltage will be lower with the use of the sacrificial contact, the geometries, dimensions, materials, etc., of each configuration of electrical fuse will determine by how much the programming voltage will be lowered.

Once programmed or blown, part of the silicide layer electromigrates away from the fuse link near the cathode pad 304 to a position 402. In this state, the electrical fuse is said to be programmed or blown, i.e., the resistance of the electrical fuse across the fuse link 308 has increased significantly, e.g., from 100 ohms to 10K ohms.

Therefore, the above described electrical fuses require a significantly lower programming power than current electrical fuses. Furthermore, standard semiconductor fabrication techniques may be used to fabricate the above described electrical fuses, i.e., the fabrication process is compatible with current mainstream semiconductor processes, in that no additional process steps are required. The sacrificial contacts are simply formed at the same time as the other contacts. This significantly reduces design complexity and manufacturing costs. In other words, the electrical fuse of the invention can be fabricated using common materials and processes to those used to fabricate the remainder of the integrated circuit.

The above described electrical fuses also occupy the same or smaller amount of space on the integrated circuit as current electrical fuses. Moreover, the present invention also reduces or eliminates the need for pump circuitry, as charge pumps with large enough capacitors to provide the higher programming voltages are no longer required. Still further, programming the above described electrical fuse provides less of a thermal disturbance to the surrounding oxide layers by having a critical to low coefficient of thermal expansion, as the electrical fuses are programmed faster and with less power, which reduces the amount of heat generated by the electrical fuse. This reduces both thermal stress in the integrated circuit and subsequent device failures.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A programmed electrical fuse comprising:
    a cathode pad;
    an anode pad; and
    a programmed fuse link between said cathode pad and said anode pad, wherein said cathode pad includes a group of electrical contacts and a solitary sacrificial electrical contact disposed a predetermined distance from said group and near said fuse link, and wherein said sacrificial electrical contact is at least partially depleted,
    wherein characteristics of the electrical fuse, including the distance and a structure of the solitary sacrificial electrical contact in its pre-programming state, are configured to assist the electrical fuse to be fully programmed to the highest post-programming resistance when a programming voltage of significantly lower than 3.3 v is applied to the fuse.

2. The programmed electrical fuse of claim 1, wherein the programming voltage is 2.5 v or less.

* * * * *